United States Patent
Bartley et al.

(10) Patent No.: US 7,088,199 B2
(45) Date of Patent: Aug. 8, 2006

(54) METHOD AND STIFFENER-EMBEDDED WAVEGUIDE STRUCTURE FOR IMPLEMENTING ENHANCED DATA TRANSFER

(75) Inventors: Gerald Keith Bartley, Rochester, MN (US); Darryl John Becker, Rochester, MN (US); Paul Eric Dahlen, Rochester, MN (US); Philip Raymond Germann, Oronoco, MN (US); Andrew B. Maki, Rochester, MN (US); Mark Owen Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 79 days.

(21) Appl. No.: 10/857,742

(22) Filed: May 28, 2004

(65) Prior Publication Data

US 2005/0264380 A1    Dec. 1, 2005

(51) Int. Cl.
    *H01P 5/02*         (2006.01)

(52) U.S. Cl. ............... 333/24 R; 333/254; 333/26; 333/248

(58) Field of Classification Search ........... 333/239, 333/248, 26, 24 R, 254
See application file for complete search history.

(56) References Cited

U.S. PATENT DOCUMENTS

| | | | |
|---|---|---|---|
| 5,982,256 A * | 11/1999 | Uchimura et al. | 333/239 |
| 6,590,477 B1 * | 7/2003 | Elco | 333/239 |
| 6,882,239 B1 * | 4/2005 | Miller | 333/24 R |

* cited by examiner

Primary Examiner—Benny Lee
(74) Attorney, Agent, or Firm—Joan Pennington

(57) ABSTRACT

A method and stiffener-embedded waveguide structure are provided for implementing enhanced data transfer for printed circuit board applications. At least one microwave channel is defined within a stiffener. The microwave channel provides a high frequency path for data transfers. Use of the waveguide channel in the stiffener for data transfers can replace or supplement otherwise required transmission paths in an associated printed circuit board.

12 Claims, 4 Drawing Sheets

US 7,088,199 B2

METHOD AND STIFFENER-EMBEDDED WAVEGUIDE STRUCTURE FOR IMPLEMENTING ENHANCED DATA TRANSFER

FIELD OF THE INVENTION

The present invention relates generally to the data processing field, and more particularly, relates to a method and stiffener-embedded waveguide structure for implementing enhanced data transfer for printed circuit board and system applications.

DESCRIPTION OF THE RELATED ART

Current high performance computer systems and server systems rely on both large-scale packaging of multiple high density interconnect modules and printed circuit boards. High signal speed integrated circuit devices are being fabricated in increasingly smaller sizes and requiring increasing numbers of connector pins or other connection interface structures within a spatial footprint. An increasing number of printed circuit board signal traces are required.

As system performance requirements increase, the associated demand for higher performance processors results in a drastic increase in high speed signal routing requirements for printed circuit board applications. Particularly with the increased signal speed of integrated circuit devices, it is quite difficult to design a printed circuit board that satisfies required signal routing requirements. The increased signal performance and routing requirements of printed circuit boards are not easily met with existing technologies.

A need exists for an effective mechanism for implementing enhanced data transfer for printed circuit board applications.

As used in the present specification and claims, the terms "printed circuit board" or "PCB" means a substrate or multiple layers (multi-layer) of substrates used to electrically attach electrical components and should be understood to generally include circuit cards, printed circuit cards, printed wiring cards, and printed wiring boards.

SUMMARY OF THE INVENTION

Principal aspects of the present invention are to provide a method and stiffener-embedded waveguide structure for implementing enhanced data transfer for printed circuit board and system applications. Other important aspects of the present invention are to provide such method and stiffener-embedded waveguide structure for implementing enhanced data transfer substantially without negative effect and that overcome many of the disadvantages of prior art arrangements.

In brief, a method and stiffener-embedded waveguide structure are provided for implementing enhanced data transfer for printed circuit board applications. At least one microwave channel is defined within a stiffener. The microwave channel is used as a high frequency path for data transfers.

In accordance with features of the invention, using the waveguide channel in the stiffener for data transfers can replace or supplement otherwise required transmission paths in an associated printed circuit board. One or more microwave channels can be entirely contained within a single stiffener, or, routed to the edge of a stiffener to allow stiffener-to-stiffener interconnect either by direct connection or by conventional wave guide components.

In accordance with features of the invention, the microwave channel enables a high data transfer rate. The flexibility of point-to-point and multi-drop configurations is enabled. A microwave channel mating arrangement for a pair of stiffeners enables data transfer from one backplane to another backplane. A launch and receive component is connected to the microwave channel and an associated printed circuit board or a backplane supported by the stiffener. A sniffer component is connected to the microwave channel enabling multi-drop configurations.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiments, a method is provided to overcome insufficient signal trace bandwidth and routability in a printed circuit board (PCB) by providing an electrical path through an embedded waveguide in a stiffener in a computer system design. There are no known solutions instead of the PCB.

In accordance with features of the preferred embodiments, a main advantage over existing technology is that routing high speed interfaces through the stiffener instead of using the PCB for routing these signals results in more PCB area which can be used for added function or provide a more compact design. Another advantage is the rate at which data transfer can be made while maintaining the option of point-to-point or multi-drop topologies.

Figure 1:
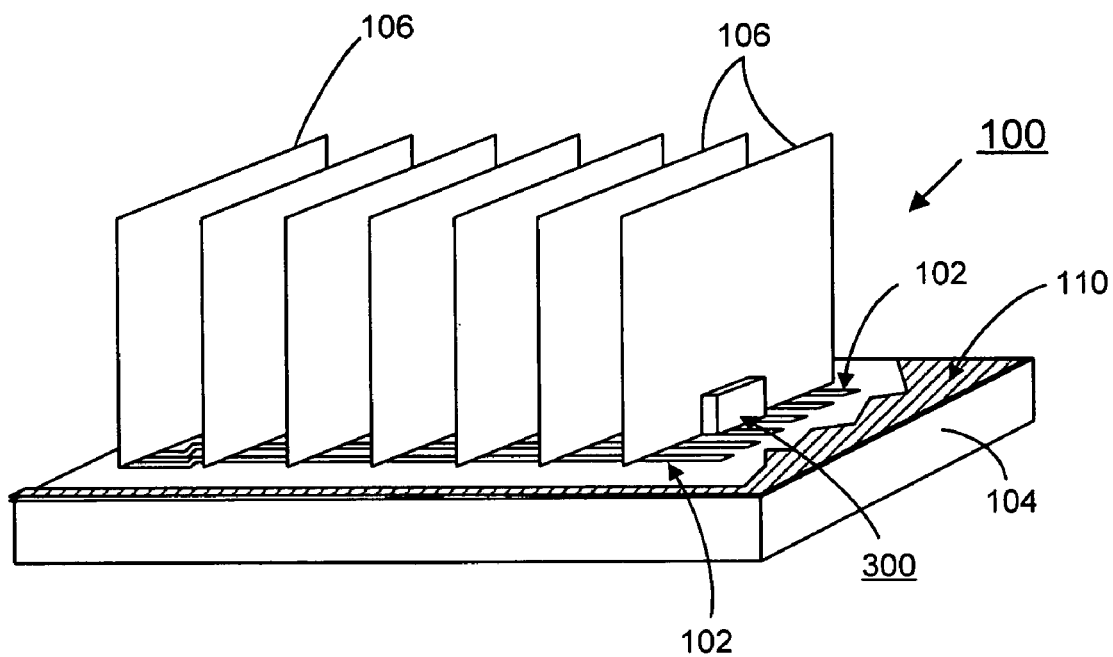
FIG. 1 is a perspective view partly broken away illustrating an exemplary stiffener-embedded waveguide structure for implementing enhanced data transfer for printed circuit board applications in accordance with the preferred embodiment.

Having reference now to the drawings, in FIG. 1, there is shown an exemplary stiffener-embedded waveguide structure generally designated by the reference character 100 for implementing enhanced data transfer for printed circuit board applications in accordance with the preferred embodiment. Stiffener-embedded waveguide structure 100 includes at least one elongated waveguide channel 102 for implementing enhanced data transfer defined in a stiffener 104. Stiffener-embedded waveguide structure 100, as shown partly broken away, includes a plurality of elongated waveguide channels 102 is formed in the stiffener 104. The elongated waveguide channels 102 are contained within the stiffener 104 defining enclosed channels.

The stiffener 104 supports a plurality of printed circuit boards 106. Each printed circuit board 106 typically includes multiple patterned conductive layers interleaved with layers of high dielectric material, these various layers not being shown, in the form of a laminate. Stiffener-embedded waveguide structure 100 includes a backplane 110 supported by the stiffener 104.

In accordance with features of the preferred embodiments, each elongated waveguide channel 102 through stiffener 104 provides a high frequency path for data transfer, for example, within a computer system design. The data are transferred through waveguide channel structures 102 rather than conventional copper transmission paths in a printed circuit board 106. Since these signals are not passed through the printed circuit board 106, unused space is provided in the PCB for other functionality. Interface performance is at least maintained relative to existing requirements and has potential to surpass existing technology, for example, with data transfer frequencies in the 10–20 of GHz range. Data transfer is allowed between components contained only within the backplane structure 110; between components on the backplane 110 and the circuit cards 106; and between components on one circuit card 106 to another circuit card 106.

In accordance with features of the preferred embodiments, embedded single or multiple waveguide channels 102 in the stiffener 104 provide interconnection for high-speed data transfers. Waveguide channels 102 enables point-to-point, bidirectional interconnects; and multi-drop configurations. One or multiple microwave channels 102 can be entirely contained within a single stiffener 104, or, routed to the edge of the stiffener 104 to allow stiffener-to-stiffener (board-to-board) interconnect either by direct connection or by conventional wave guide components.

Figure 2A:
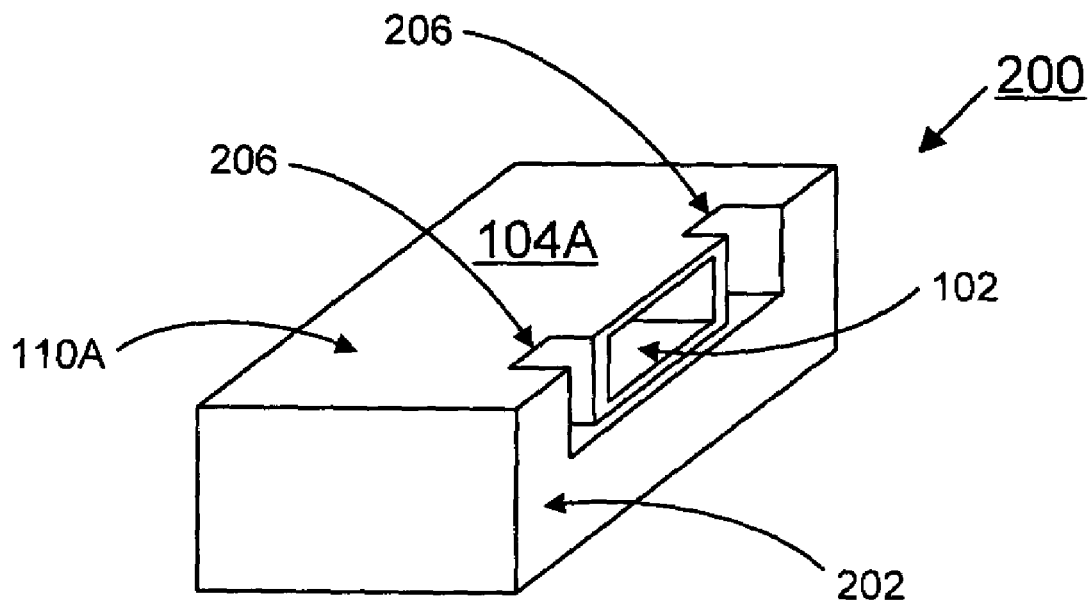
FIGS. 2A and 2B are perspective views illustrating an exemplary microwave channel mating arrangement for multiple stiffeners in accordance with the preferred embodiment.
Figure 2B:
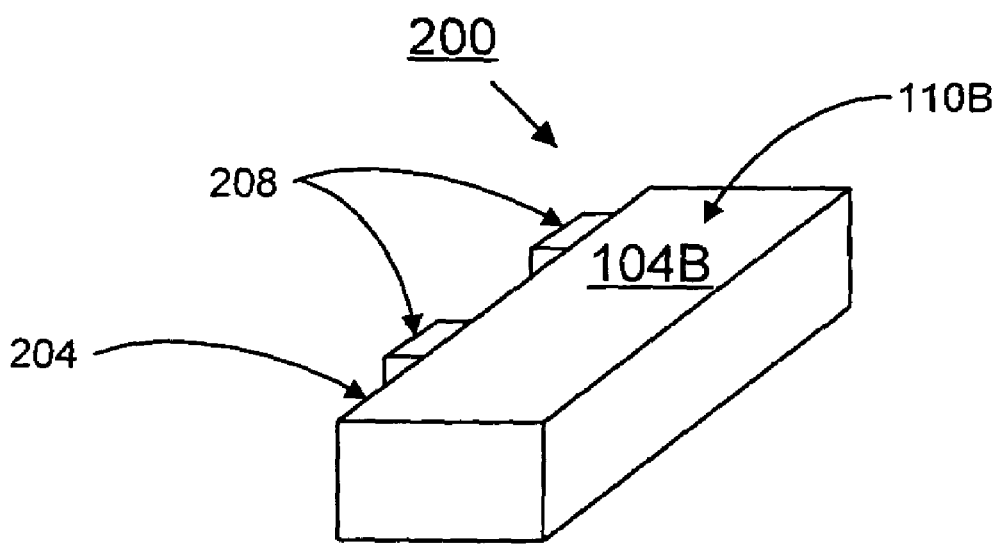

Referring also to FIGS. 2A and 2B there is shown an exemplary microwave channel mating arrangement generally designated by the reference character 200 for a pair of stiffeners 104A (FIG. 2A), 104B (FIG. 2B) enables data transfer from one backplane 110A (FIG. 2A) to another backplane 110B (FIG. 2B) in accordance with the preferred embodiment. A mating face 202 (FIG. 2A), 204 (FIG. 2B) of the respective stiffeners 104A, 104B includes a plurality of corresponding positioning and alignment features 206 (FIG. 2A), 208 (FIG. 2B) proximate to the single illustrated microwave channel 102 (FIG. 2A). The corresponding positioning and alignment features 206, 208 of the pair of stiffeners 104A, 104B are generally mirrored features for mating engagement together. The positioning and alignment features 206, 208 of the pair of stiffeners 104A, 104B enable precise, direct connection of the stiffeners and microwave channel 102 (FIG. 2A).

It should be under stood that the present invention is not limited to the illustrated microwave channel mating arrangement of FIGS. 2A and 2B. For example, an external waveguide channel adapter could be used to route the data between the two stiffeners 104. This would allow for the stiffeners 104 to be located in different physical locations within and system but yet maintain the connectability options and data transfer rate provided by one or more stiffener embedded microwave channel 102.

As best seen in FIG. 2A, elongated waveguide channel 102 preferably has a rectangular shape, but may be spherical, cylindrical, elliptical and the like. The rectangular waveguide 102 is dimensioned for a desired frequency range, for example, such that generally only the transversal-electrical 10 mode (TE-10 mode) is capable of propagation and higher modes experience a strong attenuation.

Figure 3:
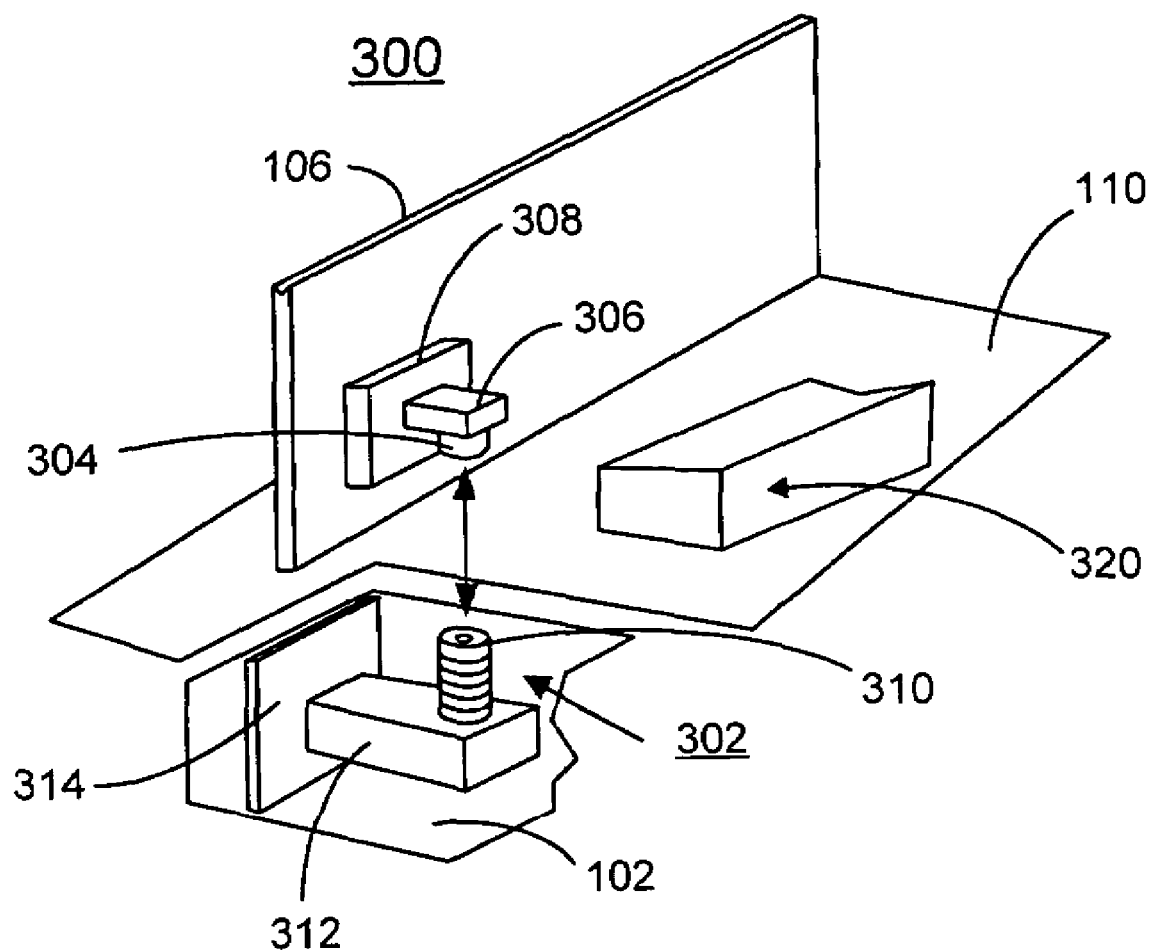
FIG. 3 is a perspective view illustrating an exemplary printed circuit card launch and receive components for implementing data transfer in accordance with the preferred embodiment.

Referring now to FIG. 3, there are shown an exploded view of an exemplary printed circuit card launch and receive component generally designated by the reference character 300 for implementing data transfer accordance with the preferred embodiment. The launch and receive component 300 is illustrated with the stiffener-embedded waveguide structure 100 in FIG. 1.

In the launch and receive component 300, a launch and receive waveguide structure is generally designated by the reference character 302. The launch and receive waveguide structure 302 includes a launch and receive stem or metallic post 304 extending downwardly from a first support member 306 carried by a second support member 308 mounted to the printed circuit board 106. The launch and receive waveguide structure 302 includes a coaxial aligned launch and receive element 310 extending upwardly from a longitudinally extending support member 312 carried by a second support member 314 mounted at the end of the rectangular waveguide 102. A cover member is generally designated by the reference character 320. The cover member 320 supported on backplane 110, surrounds or contains the launch and receives waveguide structure 302 in assembled form. For example, a quasi TEM-00 mode of the circular launch and receive waveguide structure 302 is changed to the TE-10 mode of the rectangular waveguide 102.

Figure 4A:
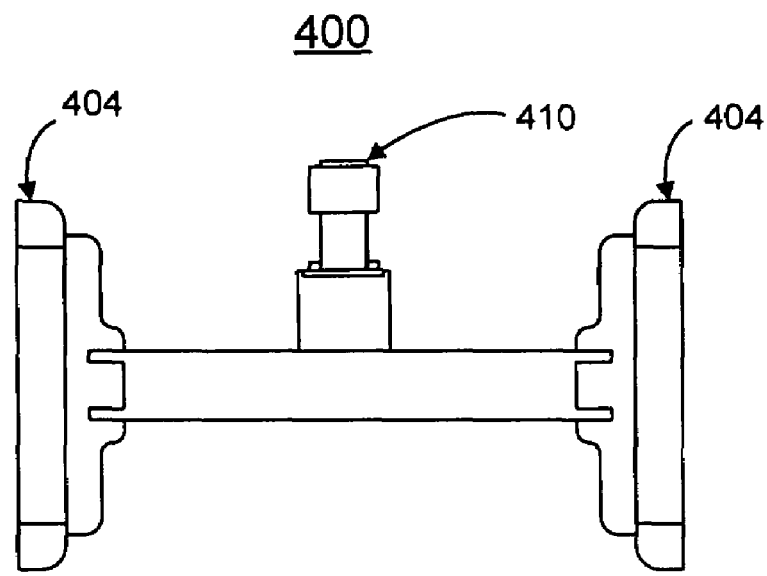
FIGS. 4A and 4B are side and end views illustrating an exemplary microwave channel sniffer component for data transfer between printed circuit cards in accordance with the preferred embodiment.
Figure 4B:
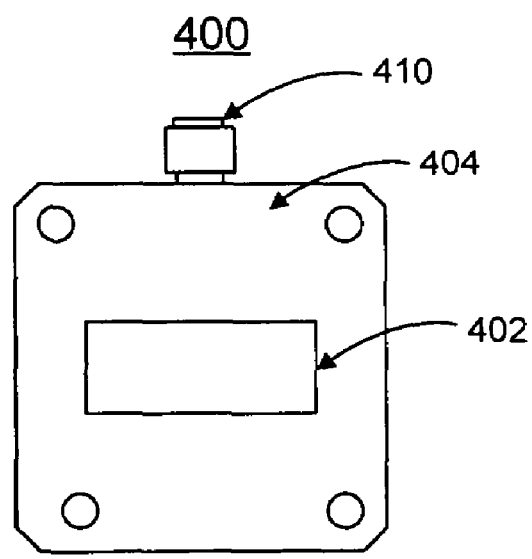

Referring now to FIGS. 4A and 4B there are shown side and end views illustrating an exemplary microwave channel sniffer component generally designated by the reference character 400 for implementing data transfer, for example, between printed circuit cards 106 in accordance with the preferred embodiment. The sniffer function 400 samples a copy of a data transfer allowing for multi-drop configurations.

Microwave channel sniffer component 400 includes a rectangular waveguide channel 402 extending between and through a pair of flange members 404. The waveguide channel 402 (FIG. 4B) is inserted within a particular rectangular waveguide 102 in the stiffener 104 with the flange members 404 received within mating recesses (not shown) in the stiffener 104 for providing positioning and alignment. Microwave channel sniffer component 400 includes a sniffer data transfer copy circuitry and connection generally designated by reference character 410, provides a connection for example, to a component on an associated printed circuit board 106 or backplane 110.

It should be understood that the present invention is not limited to the illustrated launch and receive component 300 or the illustrated microwave channel sniffer component 400. It should be understood that various other configurations could be provided for the launch and receive component 300 and the microwave channel sniffer component 400. For example, the launch and receive waveguide structure 302 may be cylindrical, spherical, elliptical or rectangular shaped. The microwave channel sniffer component 400 could be implemented with a metal plate mounted directly onto the rectangular waveguide 102 in the stiffener 104 with the metal plate carrying sniffer data transfer copy circuitry and connection functions.

While the present invention has been described with reference to the details of the embodiments of the invention shown in the drawing, these details are not intended to limit the scope of the invention as claimed in the appended claims.

What is claimed is:

1. A method for implementing enhanced data transfer for printed circuit board applications comprising the steps of:

defining a microwave channel contained within a first stiffener, said first stiffener; supporting an associated printed circuit board and a backplane;

utilizing said microwave channel as a high frequency path for data transfers; said microwave channel contained within said first stiffener; including the steps of providing a microwave channel mating arrangement including a second stiffener, and a mating microwave channel defined within said second stiffener for mating with said microwave channel defined within said first stiffener to enable data transfer.

2. A method for implementing enhanced data transfer for printed circuit board applications as recited in claim 1 wherein the step of defining said microwave channel contained within said first stiffener includes the steps of defining at least one microwave channel having a rectangular shape.

3. A method for implementing enhanced data transfer for printed circuit board applications as recited in claim 2 wherein said waveguide channel of rectangular shape is dimensioned for a desired frequency range.

4. A method for implementing enhanced data transfer for printed circuit board applications as recited in claim 2 wherein said waveguide channel of rectangular shape is dimensioned for propagation of a transversal-electrical 10 mode (TE-10 mode) and for attenuation of higher modes.

5. A method for implementing enhanced data transfer for printed circuit board applications as recited in claim 1 wherein the step of utilizing said microwave channel as a high frequency path for data transfers further includes the steps of connecting a launch and receive component to microwave channel.

6. A method for implementing enhanced data transfer for printed circuit board applications as recited in claim 5 includes connecting said launch and receive component to a selected one of said associated printed circuit board and said backplane supported by said first stiffener.

7. A stiffener-embedded waveguide structure for implementing enhanced data transfer for printed circuit board applications:
   a first stiffener;
   a microwave channel defined by and contained within said first stiffener; said first stiffener supporting a printed circuit board and a backplane;
   means for using said microwave channel as a high frequency path for data transfers; and
   a microwave channel mating arrangement including a second stiffener, and a mating microwave channel defined within said second stiffener for mating with said microwave channel defined within said first stiffener to enable data transfer.

8. A stiffener-embedded waveguide structure as recited in claim 7 wherein said microwave channel defined by and contained within said first stiffener is dimensioned for propagation of a transversal-electrical 10 mode (TE-10 mode) and for attenuation of higher modes.

9. A stiffener-embedded waveguide structure as recited in claim 7 wherein said microwave channel defined by and contained within said first stiffener is dimensioned for a desired frequency range.

10. A stiffener-embedded waveguide structure as recited in claim 7 further includes a plurality of printed circuit boards supported by said stiffener.

11. A stiffener-embedded waveguide structure as recited in claim 7 wherein said microwave channel defined by and contained within said first stiffener has a rectangular shape.

12. A stiffener-embedded waveguide structure as recited in claim 7 further includes at least one launch and receive component connected to said microwave channel.

* * * * *